(12) United States Patent
Nagulapalli et al.

(10) Patent No.: US 9,722,555 B1
(45) Date of Patent: Aug. 1, 2017

(54) DIFFERENTIAL CIRCUITS WITH CONSTANT $G_M$ BIAS

(71) Applicant: INPHI CORPORATION, Santa Clara, CA (US)

(72) Inventors: Rajasekhar Nagulapalli, Northampton (GB); Simon Forey, Northampton (GB); Parmanand Mishra, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/160,912

(22) Filed: May 20, 2016

(51) Int. Cl.
*H03F 3/45* (2006.01)
*H03F 1/34* (2006.01)

(52) U.S. Cl.
CPC .......... *H03F 3/45183* (2013.01); *H03F 1/34* (2013.01); *H03F 2200/156* (2013.01); *H03F 2203/45022* (2013.01); *H03F 2203/45112* (2013.01); *H03F 2203/45244* (2013.01)

(58) Field of Classification Search
CPC .......... H03F 1/34; H03F 3/45; H03F 3/45183; H03F 3/45479; H03F 3/45488; H03F 3/456; H03F 2203/45401; H03F 2203/45081

USPC ........................................................ 330/258
See application file for complete search history.

(56) References Cited

U.S. PATENT DOCUMENTS

| | | | | |
|---|---|---|---|---|
| 5,008,632 A | * | 4/1991 | Sutterlin | H03F 1/30 330/258 |
| 6,774,722 B2 | * | 8/2004 | Hogervorst | H03F 1/086 330/258 |
| 7,750,737 B2 | * | 7/2010 | Srinivasa | H03F 1/3211 330/258 |
| 7,924,094 B2 | * | 4/2011 | Sunairi | H03F 3/45183 330/258 |
| 9,195,245 B2 | * | 11/2015 | Nishizawa | H03F 3/45 |

\* cited by examiner

*Primary Examiner* — Khanh V Nguyen
(74) *Attorney, Agent, or Firm* — Richard T. Ogawa; Ogawa P.C.

(57) ABSTRACT

The present invention is directed to electrical circuits and techniques thereof. More specifically, embodiments of the present invention provide a differential amplifier that has a differential amplifier section, a current source, and a feedback section. The differential amplifier section comprises NMOS transistors that receives two voltage inputs and generate a differential output. The current source provides a long tail for the differential amplifier section. The feedback section generates a feedback voltage based on a reference bias voltage. The feedback voltage is used by an amplifier to control the current source and to keep the biasing and gain of the differential amplifier substantially constant. There are other embodiments as well.

20 Claims, 5 Drawing Sheets

DIFFERENTIAL CIRCUITS WITH CONSTANT $G_M$ BIAS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits and techniques thereof.

Differential amplifiers have a wide range of applications. In operation, a differential amplifier amplifies the difference between two input voltages (differential mode voltage) and suppresses voltage common (common mode voltage) to the two input voltages. For example, differential amplifiers are found in many circuits that utilize series negative feedback (op-amp follower, non-inverting amplifier, etc.), where one input is used for the input signal and the other for the feedback signal (usually implemented by operational amplifiers). For example, differential amplifiers have been used in volume control circuits and automatic gain control circuits. For data communication, differential amplifiers have also been used in amplitude modulation.

Over the past, various types of differential amplifiers have been proposed and utilized. Unfortunately, in light of high-speed and low-power applications, conventional differential amplifiers have been inadequate. Therefore, improved systems and methods for differential amplifiers are desired.

BRIEF SUMMARY OF THE INVENTION

The present invention is directed to electrical circuits and techniques thereof. More specifically, embodiments of the present invention provide a differential amplifier that has a differential amplifier section, a current source, and a feedback section. The differential amplifier section comprises NMOS transistors that respectively receive two voltage inputs and generate a differential output. The current source provides a long tail for the differential amplifier section. The feedback section generates a feedback voltage based on a reference bias voltage. The feedback voltage is used by an amplifier to control the current source and to keep the biasing and gain of the differential amplifier substantially constant. There are other embodiments as well.

According to an embodiment, the present invention provides a different amplifier device that includes a first voltage input and a second voltage input. The device includes an output resistor. The device further includes a first switch comprising a first gate and a first drain and a first source. The first gate is coupled to the first voltage input. The device also includes a second switch comprising a second gate and a second drain and a second source. The second gate is coupled to the second voltage input. The second drain is coupled to the output resistor. The device additionally includes a voltage supply. The device further includes a feedback circuit comprising a third switch and a fourth switch. The third switch and the fourth switch are coupled to the voltage supply. The device additionally includes a bias generator circuit that is coupled to the voltage supply and the feedback circuit. The bias generator circuit is configured to provide a bias reference voltage to the feedback circuit. The device additionally includes a current source comprising a fifth switch and a first amplifier. The inputs terminals of the first amplifier are coupled to the second drain and the first voltage input. The output terminal of the first amplifier is coupled to a gate of the third switch.

According to another embodiment, the present invention provides a different amplifier device that has a first voltage input and a second voltage input. The device also includes an output resistor. The device further includes a first switch comprising a first gate and a first drain and a first source. The first gate is coupled to the first voltage input. The device further includes a second switch comprising a second gate and a second drain and a second source. The second gate is coupled to the second voltage input, and the second drain is coupled to the output resistor. The device additionally includes a voltage supply. The device further includes a feedback circuit comprising a third switch and a fourth switch and a first amplifier. The third switch and the fourth switch are coupled to the voltage supply. The device further includes a bias generator circuit that is coupled to the voltage supply and the feedback circuit. The bias generator circuit is configured to provide a bias reference voltage to the feedback circuit. The device also includes a current source comprising a fifth switch and a second amplifier. The inputs terminals of the second amplifier are coupled to the second drain and the first voltage input. The output terminal of the second amplifier is coupled to a gate of the third switch.

According to yet another embodiment, the present invention provides a different amplifier device that includes a first voltage input and a second voltage input. The device includes a first switch comprising a first gate and a first drain and a first source. The first gate is coupled to the first voltage input. The device also includes a second switch that includes a second gate and a second drain and a second source. The second gate is coupled to the second voltage input. The device includes a voltage supply. The device has a feedback circuit that includes a third switch and a fourth switch and a first amplifier. The third switch and the fourth switch are coupled to the voltage supply. The feedback circuit further includes a pair of common mode resistors. The device also includes a bias generator circuit that is coupled to the voltage supply and the feedback circuit. The bias generator circuit is configured to provide a bias reference voltage to the feedback circuit. The device has a current source comprising a fifth switch and a second amplifier. The inputs terminals of the second amplifier are coupled to the second drain and the first voltage input. The output terminal of the second amplifier is coupled to a gate of the third switch. The output terminal of the second amplifier is coupled to a slave circuit.

It is to be appreciated that embodiments of the present invention provide many advantages over conventional techniques. As explained below, invariability of bias and gain for differential amplifier circuits can be an important attribute of the circuit performance. In different operating conditions, such as process, voltage, temperature (PVT) and/or other factors, it is desirable to keep bias of differential amplifier circuits substantially constant. It is to be appreciated that embodiments of the present invention uses a feedback mechanism that keeps the transconductance and biasing of the differential amplifier substantially constant, thereby allowing precise operation of the differential amplifier circuits.

Embodiments of the present invention can be implemented in conjunction with existing systems and processes. For example, differential circuits according to embodiments of the present invention can be manufactured using existing fabrication processes and equipment, and they can be readily incorporated into products that need differential amplifier circuits. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits and techniques thereof. More specifically, embodiments of the present invention provide a differential amplifier that has a differential amplifier section, a current source, and a feedback section. The differential amplifier section comprises NMOS transistors that respectively receive two voltage inputs and generate a differential output. The current source provides a long tail for the differential amplifier section. The feedback section generates a feedback voltage based on a reference bias voltage. The feedback voltage is used by an amplifier to control the current source and to keep the biasing and gain of the differential amplifier substantially constant. There are other embodiments as well.

Differential amplifiers, as explained above, have a wide range of applications. In analog circuit design, a precision reference bias is required to get the operating current or voltage from a reference. More specifically, a reference bias controls the basic operations of the main circuit, which includes an amplifier and other circuit components. The precision bias governs the variability of the main circuit (i.e., over process, voltage, and temperature) to meet the specifications. More specifically, it is desirable for differential amplifier circuits to provide substantially constant gain and/or transconductance, which can be affected by the bias point of the differential amplifier.

Figure 1:
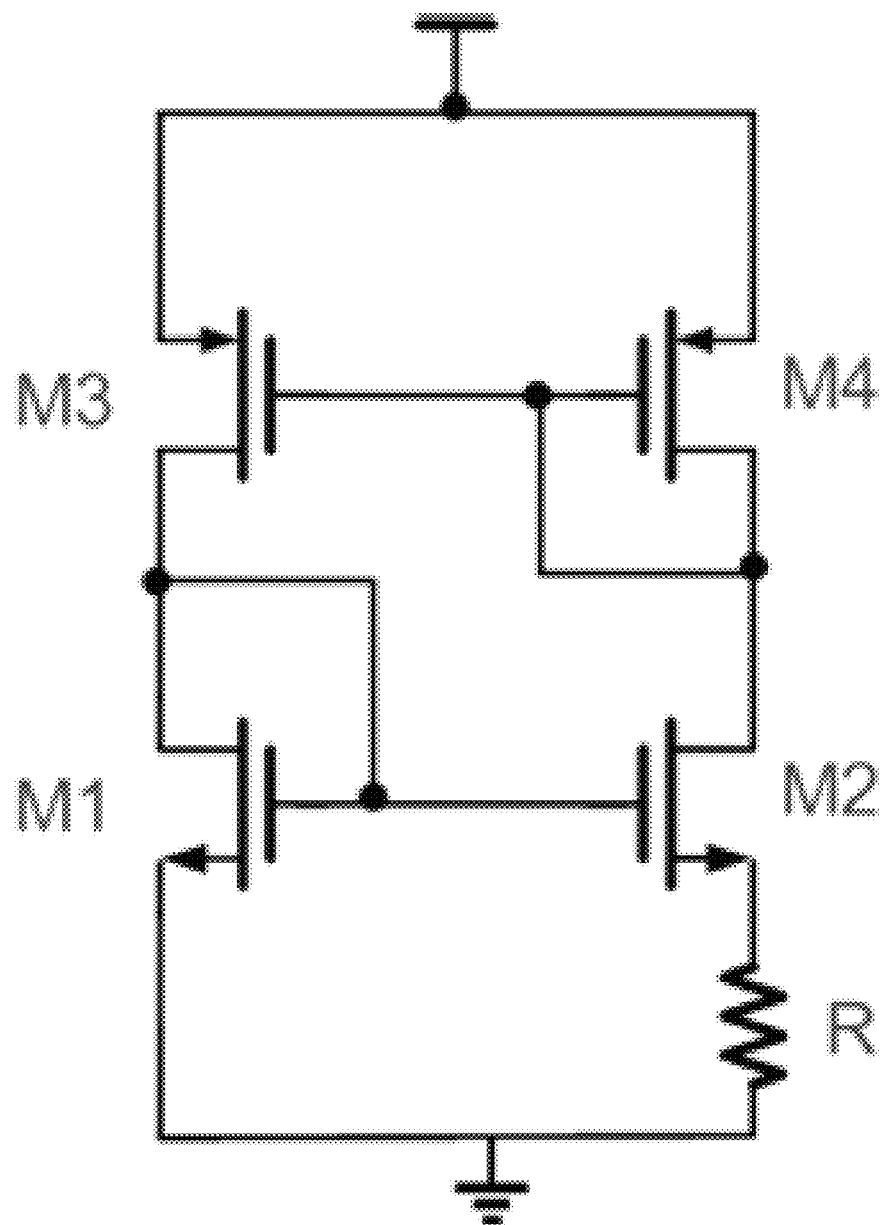
FIG. 1 is a simplified diagram illustrating a conventional differential amplifier.

FIG. 1 is a simplified diagram illustrating a conventional differential amplifier. Switches M1 and M2 form a different amplifier pair. Switches M3 and M4 form a current mirror. For example, switches M1 and M2 are implemented using NMOS switches, and switches M3 and M4 are implemented using PMOS switches. In ideal implementations of differential amplifiers implemented using NMOS transistors, a constant transconductance and bias is often assumed. For example, constant transconductance of M1 and M2 would translate to constant gain of the differential amplifier. Unfortunately, a constant transconductance bias is difficult to obtain. More specifically, $g_{m1}*R$=constant can be achieved only under square law assumption for the existing circuit, wherein $g_{m1}$ is transconductance of switch M1 and R is a resistance value of resistor R in FIG. 1. For example, transconductance values of switches M1 and M2 are very close (i.e., $g_{m1} \cong g_{m2}$), as they are typically implemented using matched NMOS transistors. There are various factors that cause the differential amplifier to deviate from the square low. For example, these factors include second order short channel effects like drain-induced barrier lowering (DIBL), hot carrier injection (HCl), velocity saturation, mobility degradation, and others. When supply changes, switch M2 drain changes due to switch M4 diode connection, but switch M1 drain remains constant. In this situation, bias is sensitive to supply variation. Additionally, bias voltages of switches M1 and M2 depends on the threshold voltage $V_{th}$, and there is limited freedom to choose based on the slave circuit that they are connected to.

According to various embodiments, the present invention provides a differential amplifier with a feedback mechanism that allows for constant transconductance bias. More specifically, the feedback mechanism maintain an almost exact relation between the transconductance $g_{m1}$ and the resistance R, which in turn translates to a substantially constant gain for the differential amplifier. Transconductance value in combination with resistance R (of the output resistor) is related to the gain of the differential amplifier. The differential amplifiers according to the present invention are implemented with NMOS transistors with current source load implemented using PMOS transistors, which provide good supply rejection. For example, NMOS transistors comprise a matched transistor pair that are characterized by substantially equally transconductance values. The differential amplifier is followed by a current source as a long tail.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
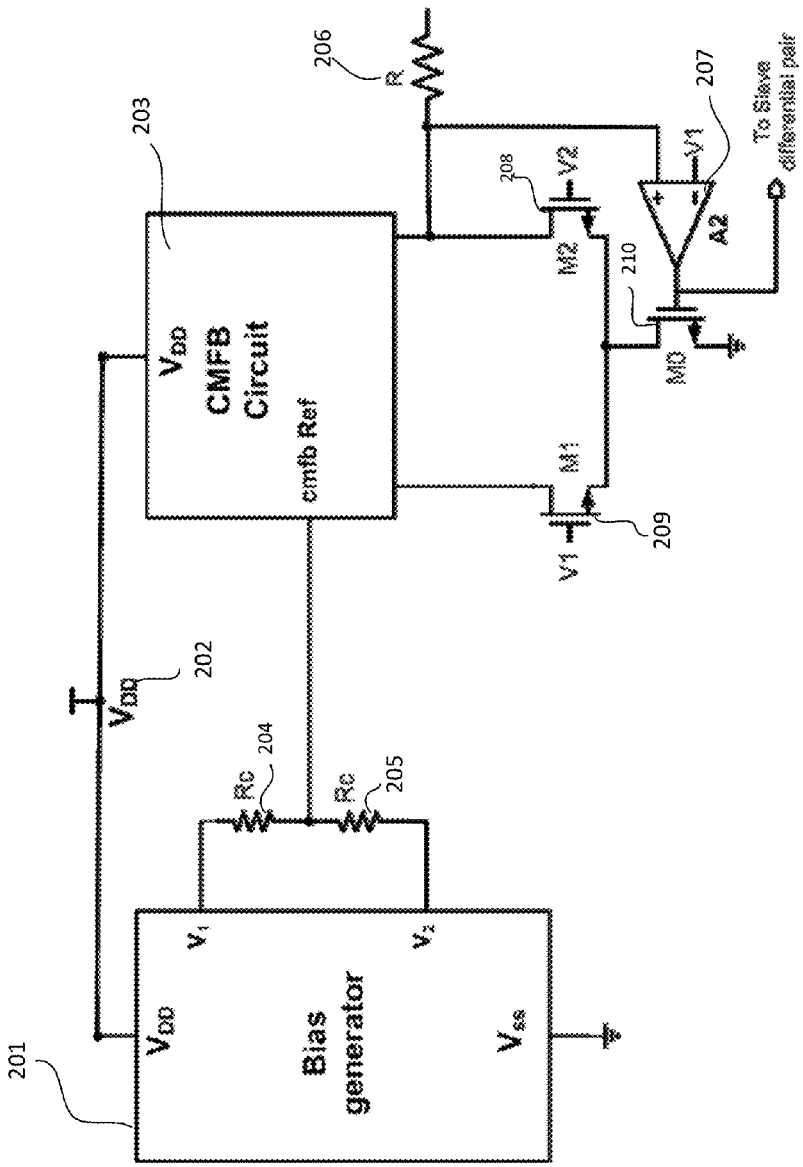
FIG. 2 is a simplified diagram illustrating a differential amplifier device 200 according to an embodiment of the present invention.

FIG. 2 is a simplified diagram illustrating a differential amplifier device 200 according to an embodiment of the present invention. This diagram is merely an example, which should not unduly limit the scope of the claims. One of ordinary skill in the art would recognize many variations, alternatives, and modifications. As shown in FIG. 2, device 200 includes a pair of NMOS switches 209 (M1) and 208 (M2). As mentioned above, NMOS switches are typically implemented as a matched pair and thus have very close transconductance value. Switches 209 and 208 together form a differential amplifier section that provides an output to the output resistor 206 based on the input $V_1$ at the gate of switch 209 and $V_2$ at the gate of switch 208. In operation, the transconductance values of the switches 208 and 209 dictate the gain of the differential amplifier. Input voltages $V_1$ and $V_2$ are specifically provided to have enough difference to provide a differential signal (i.e., $V_1-V_2$) for operation in differential mode. Switch 210 (M0) is a part of the long tail current source that is coupled to the source terminals of switches 208 and 209. For example, switch 210 and/or other components functions as a current source (or long-tail) that provides a bias point for the differential amplifier. The drain terminals of switches 208 and 209 are coupled to a feedback circuit 203. For example, the feedback circuit 203 operates in common mode, and it is receives a common feedback reference signal from the bias generator 201. More specifically, the feedback circuit 203 is coupled to the bias generator 201 via resistors 204 and 205. For example, resistors 204 and 205 are configured as common mode resistors and have much greater impedance than the 1/gds value, where "gds" is the common-source output conductance of the transistor switch. The bias generator 201 is coupled to the voltage supply $V_{DD}$ 202. Additionally, the feedback circuit 203 is also electrically coupled to the voltage supply $V_{DD}$ 202.

The bias point of the differential amplifier is provided by the current source tail that is coupled to the source terminals of the switches 208 and 209. The gate of the switch 210 is coupled to the operational amplifier (op-amp A2) 207. The input terminals of operational amplifier 207 are respectively coupled to the output terminal of switch M2 (and the feedback circuit 203) and the input $V_1$. As can be seen in FIG. 2, the positive input terminal of the op-amp 207 is also coupled to the feedback circuit 203. In operation, the op-amp 207, based on the feedback signal from feedback circuit 203, adjusts the tail current source at switch 210 until the voltage drop across resistor 206 is equal to the difference between $V_1$ and $V_2$. The transconductance of the differential amplifier, through the feedback circuit 203, is kept substantially constant.

Figure 3:
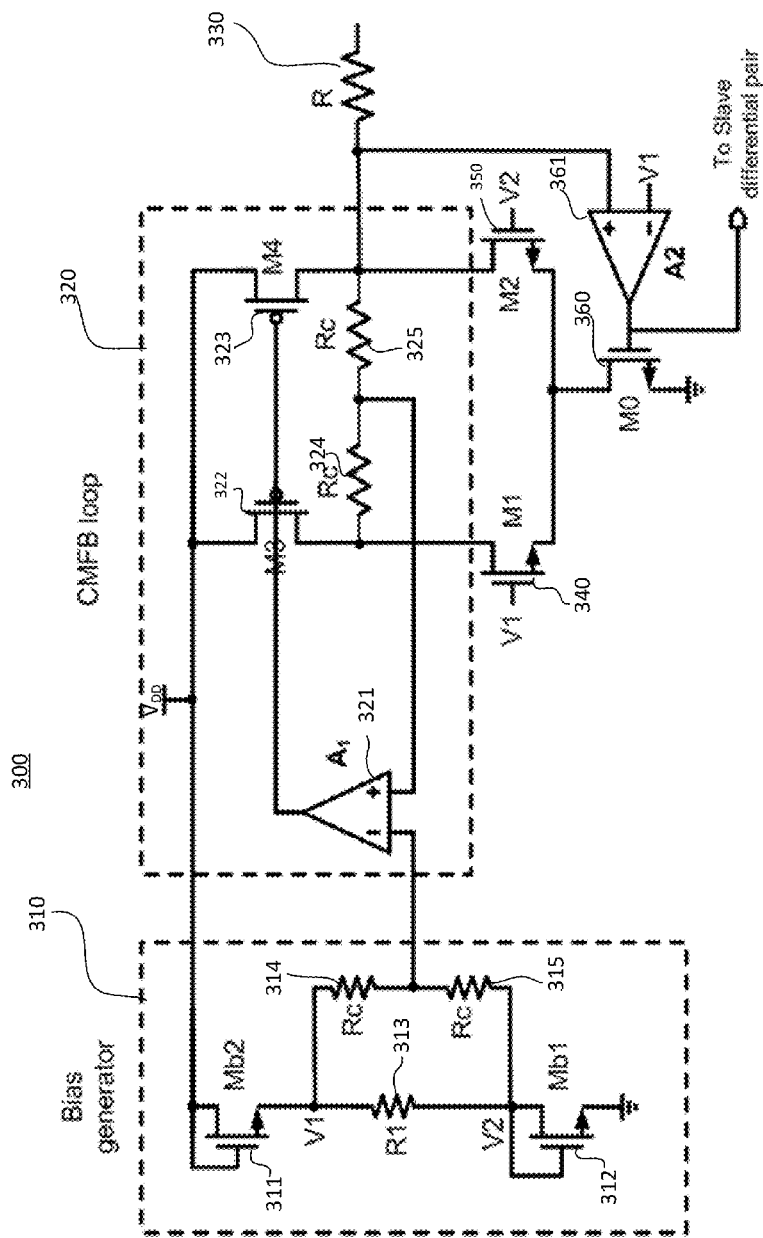
FIG. 3 is a simplified diagram illustrating a differential amplifier 300 with a feedback mechanism for constant biasing according to an embodiment of the present invention.

FIG. 3 is a simplified diagram illustrating a differential amplifier 300 with a feedback mechanism for constant biasing according to an embodiment of the present invention. This diagram is merely an example, which should not unduly limit the scope of the claims. One of ordinary skill in the art would recognize many variations, alternatives, and modifications. As shown in FIG. 3, a differential amplifier 300 includes a pair of NMOS switches 340 and 350 for the differential amplifier section, a current source, a feedback loop 320, and a bias generator 310. With a transconductance of $G_m$, the differential amplifier output a signal current $G_m*(V_1-V_2)$, and the voltage drop across the output resistors 330 is $G_m*(V_1-V_2)$. For example, transconductance $G_m$ can be the transconductance value of the switch 340 or switch 350, where the two NMOS transistors are matched and have close transconductance values.

NMOS switches 340 and 350 are coupled to the feedback loop 320. For example, feedback mechanism of the feedback loop operates in common mode. Among other components, the feedback loop 320 comprises a pair of PMOS switches 322 and 323. For example, the PMOS switches function as a current source load for the feedback loop 320. The feedback loop 320 includes an op-amp (A1) 321 that controls the gates of switches 322 and 323 based on both bias signal from the bias generator 310 and the output of the PMOS switches (between resistors 324 and 325). For example, resistors 324 and 325 can be common mode resistors ($R_c$) that provide common mode resistance, and the resistance values of resistors 324 and 325 are much greater than 1/gds, where gds is the common mode source conductance. In a specific embodiment, the resistance of resistor 324 is in the range of 250KΩ. The PMOS switches 322 and 323 are also coupled to supply voltage $V_{DD}$. The output of the PMOS switches 322 and 323 are respectively coupled to NMOS switches 340 and 350. The outputs from PMOS switches 322 and 323 are also respectively coupled to resistors 324 and 325, and subsequently coupled to the positive input of the op-amp 321. The output of op-amp 321 is coupled to the gate terminals of switches 322 and 323 to adjust the output of these two switches. For example, functioning as current source load, the outputs of the switches 322 and 323 provide source currents respectively going into switches 340 and 350.

The negative input terminal of op-amp 321 is coupled to the bias generator 310. As shown in FIG. 3, bias generator 310 includes switches 311 and 312. Switch 311 is coupled to the voltage supply $V_{DD}$, and provides an output voltage $V_1$ as shown. Switches 312 is coupled to the ground and provides an output voltage $V_2$. Output voltages $V_1$ and $V_2$ are used as input voltages of the differential amplifier and respectively coupled to the gates of switch 340 and switch 350. Resistor 313 is provided between the output of the switches 311 and 312. The bias point is based on the outputs of the switches 311 and 312 and configured between resistors 314 and 315. In a specific embodiment, a resistor is implemented in lieu of the switch 311 to avoid headroom problem, as functionally switches 311 contributes to the bias voltage provided by bias generator 310.

Now referring back to the differential amplifier section with NMOS switches 340 and 350. The bias is provided by switch 360, which functions as a current source. In operation, $V_1$ and $V_2$ are close to the required common mode of the slave circuit, and have enough difference between them to cause small signal current flows out of differential pair. For example, voltages $V_1$ and $V_2$ can be close to a function of threshold voltage $V_{th}$ and over-drive voltage $V_{ov}$ (i.e., $V_{th}+2V_{OV}$) of the slave circuit. The differential component between $V_1$ and $V_2$ needs to be sufficient to generate a small signal current, but not high enough to steer current to one side or other. The signal current flowing out of the differential pair (i.e., switches 340 and 350) is $G_m*(V_1-V_2)$, whereas $G_m$ is the transconductance of switches 340 and/or 350. For example, switches 340 and 350 may be a matched pair of NMOS transistors and therefore have close (almost equal) transconductance values. The output of the differential pair 340 and 350 is thus a signal current $G_m*(V_1-V_2)$. The voltage drop through resistor 330 therefore is $R*G_m*(V_1-V_2)$, where R is the resistance value of resistor 330.

The bias of the differential pair 340 and 350 is provided by the op-amp 360. More specifically, op-amp 360 adjusts the tail current source $M_0$ (switch 3660) until the voltage drop across resistor 330 is equal to $(V_1-V_2)$. By keeping the voltage drop across resistor 330 substantially constant, the value of $R*G_m$ is also substantially constant. The PMOS resistors 322 and 323 of the feedback loop 320 are controlled by, via their respective gates, op-amp 321, which forces transcondctor output close to $V_1$. The reference voltage used by the op-amp 321, as explained above, is provided by the bias generator 310. For example, the bias generator 310 may be implemented in various ways, and there are existing reference bias generators used in other systems. In various embodiments, op-amp 321 and the op-amp 361 are configured using different output stages to minimize systematic offset. In a specific embodiment, op-amp 321 is implemented using an NMOS based output stage and op-amp 361 is implemented using a PMOS based output stage.

Now referring back to the current source section, which includes switch 360. As shown in FIG. 3, the gate of switch 360 is coupled to both the op-amp 361 and a slave circuit, which may be a differential pair. For example, switch 360 is implemented using an NMOS transistors, but it is to be understood that other implementations as possible as well. The gate of switch 360 is coupled to the output of the op-amp 361.

In describing performance of NMOS switches of the differential amplifier, Sakurai's Alpha Power Model may be used to provide Equation 1 below:

$$I = \frac{\mu_n C_{ox}}{2} \frac{W}{L}(V_{gs} - V_{th})^\alpha \quad \text{Equation 1}$$

The transconductance can be derived from Equation 1 and expressed under Equation 2 below:

$$g_m = \frac{\mu_n C_{ox}}{2} \frac{W\alpha}{L}(V_{gs} - V_{th})^{\alpha-1} \quad \text{Equation 2}$$

The feedback loop adjust the transistor current I to provide:

$$g_m = 1/R \quad \text{Equation 3:}$$

Based on Equations 2 and 3, Equation 4 can be obtain as shown below:

$$\frac{1}{R} = \frac{\mu_n C_{ox} W \alpha}{2L}((V_{gs} - V_{th}))^{\alpha-1} \quad \text{Equation 4}$$

$$V_{gs} - V_{th} = \left(\frac{2}{\alpha R \mu_n C_{ox} \frac{W}{L}}\right)^{\frac{1}{1-\alpha}}$$

$$V_{gs} = \left(\frac{2}{\alpha R \mu_n C_{ox} \frac{W}{L}}\right)^{\frac{1}{1-\alpha}} + V_{th}$$

Using the Equation 4, the overdrive voltage required for a given size of the differential pair can be determined, and the source node voltage $V_s$ can be expressed using Equation 5 below:

$$V_5 = V_1 - \left(\frac{2}{\alpha R \mu_n C_{ox} \frac{W}{L}}\right)^{\frac{1}{1-\alpha}} + V_{th} \quad \text{Equation 5}$$

Using Equation 5, the tail current source drain potential can be determined or estimated, which dictates the tail current size for carrying the required current for operation. For example, by substituting $\alpha=2$, we can obtain equations corresponding to standard square law device, thereby achieve the substantially constant gain.

Figure 4:
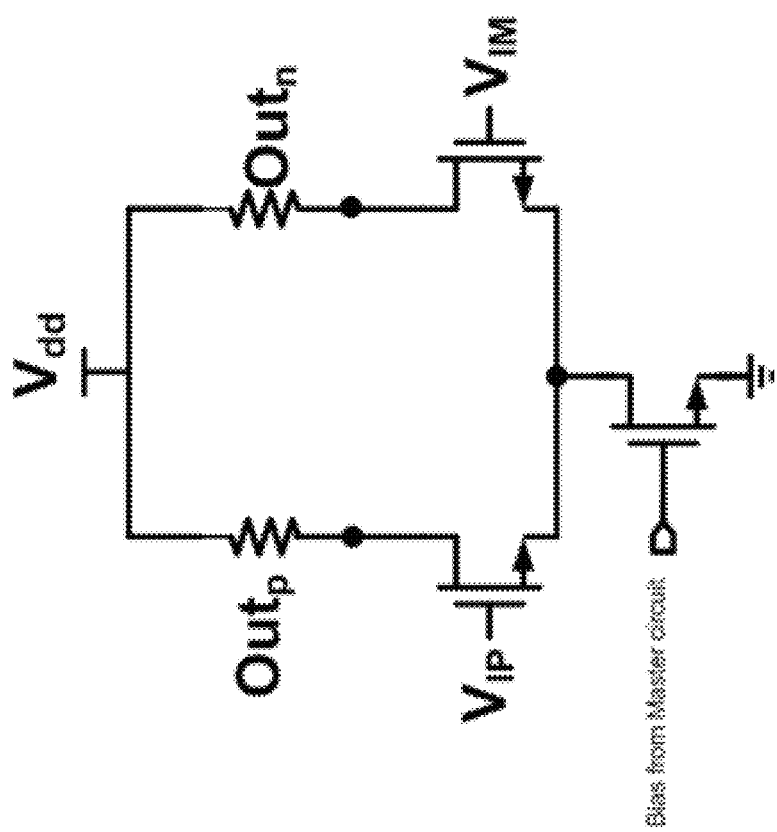
FIG. 4 is a simplified diagram illustrating a test circuit for differential amplifiers according to embodiments of the present invention.

It is to be appreciated that differential amplifiers illustrated in FIGS. 2 and 3 and described above can provide a substantially constant $G_m$ bias, and these configurations have been tested and simulated. FIG. 4 is a simplified diagram illustrating a test circuit for differential amplifiers according to embodiments of the present invention. This diagram is merely an example, which should not unduly limit the scope of the claims. One of ordinary skill in the art would recognize many variations, alternatives, and modifications. As shown in FIG. 4, the bias is coupled to gate of a current source, and the bias is from a master circuit. For example, the test circuit illustrated in FIG. 4 can be coupled to the differential amplifiers in FIG. 2 and/or FIG. 3.

Figures 5A, 5B:
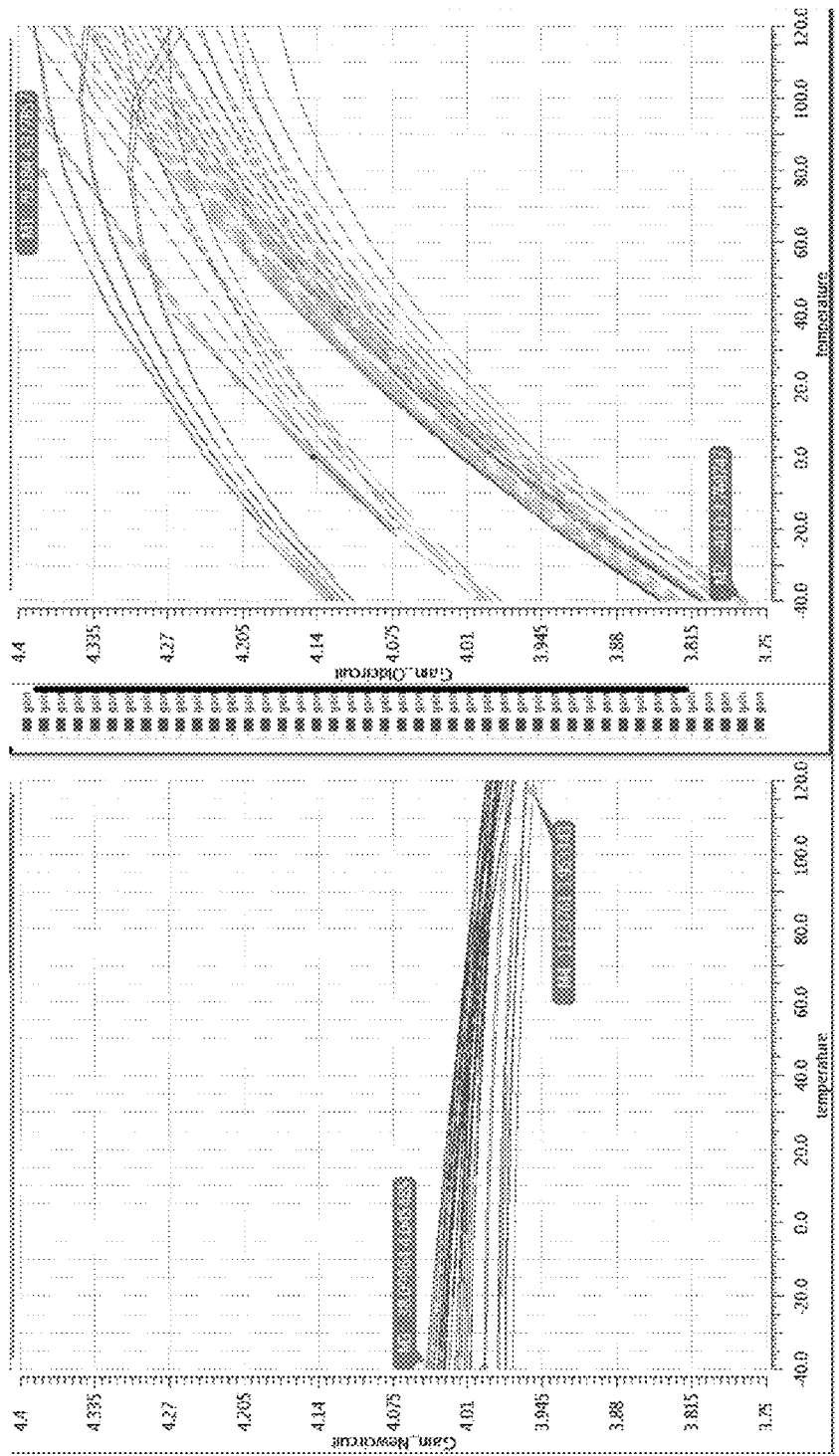
FIGS. 5A and 5B are a diagram illustrating the advantages afford by differential amplifiers according embodiments of the present invention.

FIGS. 5A and 5B are a diagram illustrating the advantages afforded by differential amplifiers according embodiments of the present invention. As shown in plot 5A, which is simulation results of a differential amplifier according to an embodiment of the present invention, as tested using a test circuit illustrated in FIG. 4, the gain of the differential amplifier (function of bias and transconductance of the differential amplifier) is substantially constant within a range of 3.95 to 4.045 for a temperature range from −40 degrees Celsius to 120 degrees Celsius. In comparison, conventional differential amplifiers exhibit a much higher degree of variance at different temperatures, as shown in FIG. 5B. It is to be appreciated that the gain and bias parameters are substantially constant and stable over not only temperature, but also other factors, such as process, voltage, and other factors.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A different amplifier device comprising:
a first voltage input and a second voltage input;
an output resistor;
a first switch comprising a first gate and a first drain and a first source, the first gate being coupled to the first voltage input;
a second switch comprising a second gate and a second drain and a second source, the second gate being coupled to the second voltage input, the second drain being coupled to the output resistor;
a voltage supply;
a feedback circuit comprising a third switch and a fourth switch, the third switch and the fourth switch being coupled to the voltage supply;
a bias generator circuit being coupled to the voltage supply and the feedback circuit, the bias generator circuit being configured to provide a bias reference voltage to the feedback circuit; and
a current source comprising a fifth switch and a first amplifier, input terminals of the first amplifier being coupled to the second drain and the first voltage input, the output terminal of the first amplifier being coupled to a gate of the fifth switch.

2. The device of claim 1 wherein the first switch and the second switches are NMOS switches.

3. The device of claim 1 wherein the first amplifier is configured to adjust the fifth switch until a voltage drop across the output resistor is equal to a different between the first voltage input and the second voltage input.

4. The device of claim 1 wherein the third switch and the fourth switch are PMOS switches.

5. The device of claim 1 wherein feedback circuit further comprising a second amplifier, the output of the second amplifier being coupled to the gates of the third switch and the fourth switch.

6. The device of claim 1 wherein the bias generator circuit comprises a sixth switch and a seventh switch.

7. The device of claim 6 wherein the sixth switch and the seventh switch are NMOS switches.

8. The device of claim 1 wherein the fifth switch is coupled to the first source and the second source.

9. The device of claim 1 wherein the first switch is characterized by a substantially constant transconductance value.

10. The device of claim 1 wherein the feedback circuit comprises a pair of resistors respectively coupled to the third switch and the fourth switch.

11. The device of claim 10 wherein a common terminal of the pair of resistor is coupled to an input of a second amplifier.

12. The device of claim 1 wherein a gate of the fifth switch is coupled to a slave circuit.

13. The device of claim 12 wherein a voltage of the first voltage input is close to a common mode voltage of the slave circuit.

14. The device of claim 1 wherein the feedback circuit comprises a pair of common mode resistors.

15. A different amplifier device comprising:
a first voltage input and a second voltage input;
an output resistor;
a first switch comprising a first gate and a first drain and a first source, the first gate being coupled to the first voltage input;
a second switch comprising a second gate and a second drain and a second source, the second gate being coupled to the second voltage input, the second drain being coupled to the output resistor;
a voltage supply;
a feedback circuit comprising a third switch and a fourth switch and a first amplifier, the third switch and the fourth switch being coupled to the voltage supply;
a bias generator circuit being coupled to the voltage supply and the feedback circuit, the bias generator circuit being configured to provide a bias reference voltage to the feedback circuit; and
a current source comprising a fifth switch and a second amplifier, input terminals of the second amplifier being coupled to the second drain and the first voltage input, the output terminal of the second amplifier being coupled to a gate of the fifth switch.

16. The device of claim 15 wherein the first amplifier comprises an NMOS based output stage.

17. The device of claim 15 wherein the second amplifier comprises an PMOS based output stage.

18. A different amplifier device comprising:
a first voltage input and a second voltage input;
a first switch comprising an NMOS transistor having a first gate and a first drain and a first source, the first gate being coupled to the first voltage input;
a second switch comprising an NMOS transistor having a second gate and a second drain and a second source, the second gate being coupled to the second voltage input;
a voltage supply;
a feedback circuit comprising a third switch and a fourth switch and a first amplifier, the third switch and the fourth switch being coupled to the voltage supply, the feedback circuit further comprising a pair of common mode resistors;
a bias generator circuit being coupled to the voltage supply and the feedback circuit, the bias generator circuit being configured to provide a bias reference voltage to the feedback circuit; and
a current source comprising a fifth switch and a second amplifier, input terminals of the second amplifier being coupled to the second drain and the first voltage input, the output terminal of the second amplifier being coupled to a gate of the fifth switch, the output terminal of the second amplifier being coupled to a slave circuit.

19. The device of claim 18 wherein the pair of common mode resistors is characterized by a resistance value greater than a common mode source impedance of the fifth switch.

20. The device of claim 18 wherein the bias generator comprises a bias transistor and a bias resistor, the bias resistor being coupled to a voltage supply.

* * * * *